US007790590B2

(12) United States Patent
Gonohe et al.

(10) Patent No.: US 7,790,590 B2
(45) Date of Patent: Sep. 7, 2010

(54) SELECTIVE W-CVD METHOD AND METHOD FOR FORMING MULTI-LAYERED CU ELECTRICAL INTERCONNECTION

(75) Inventors: Narishi Gonohe, Shizuoka (JP); Masamichi Harada, Shizuoka (JP); Nobuyuki Kato, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 27 days.

(21) Appl. No.: 11/886,428

(22) PCT Filed: Mar. 13, 2006

(86) PCT No.: PCT/JP2006/304871

§ 371 (c)(1), (2), (4) Date: Aug. 21, 2008

(87) PCT Pub. No.: WO2006/098259

PCT Pub. Date: Sep. 21, 2006

(65) Prior Publication Data

US 2008/0311741 A1 Dec. 18, 2008

(30) Foreign Application Priority Data

Mar. 14, 2005 (JP) ............................ 2005-070290

(51) Int. Cl.
*H01L 21/20* (2006.01)
*H01L 21/44* (2006.01)

(52) U.S. Cl. ................ 438/584; 438/674; 257/E21.585

(58) Field of Classification Search ............ 204/192.15, 204/192.3, 192.12, 192.17, 298.06; 427/252, 427/255.394, 126.1, 249.8; 438/618, 680, 438/775, 656, 622, 652, 597, 584, 674; 257/E21.585, 257/213, 532, 758, 763; 428/447
See application file for complete search history.

(56) References Cited

U.S. PATENT DOCUMENTS

| | | | | |
|---|---|---|---|---|
| 3,785,862 | A * | 1/1974 | Grill | 438/674 |
| 4,918,033 | A * | 4/1990 | Bartha et al. | 438/680 |
| 5,525,550 | A * | 6/1996 | Kato | 438/788 |
| 6,818,546 | B2 * | 11/2004 | Saito et al. | 438/618 |
| 2005/0070730 | A1 * | 3/2005 | Bannou et al. | 556/465 |

FOREIGN PATENT DOCUMENTS

| | | | |
|---|---|---|---|
| JP | 10-229054 | A | 8/1998 |
| JP | 2000-294555 | A | 10/2000 |
| JP | 2004-146516 | A | 5/2004 |
| KR | 1998-042907 | A | 8/1998 |
| KR | 2002-25806 | A | 4/2002 |
| WO | WO03/040156 | * | 5/2003 |

* cited by examiner

*Primary Examiner*—Thomas L Dickey
*Assistant Examiner*—Nikolay Yushin
(74) *Attorney, Agent, or Firm*—Arent Fox LLP

(57) ABSTRACT

A substrate provided thereon with an electrical insulating film which carries holes or the like filled with a Cu-containing electrical interconnection film is subjected to a pre-treatment in which the surface of the electrical insulating film and that of the Cu-containing electrical interconnection film are treated at a temperature of not more than 300° C. using, in a predetermined state, a gas of a compound containing an atom selected from the group consisting of N, H and Si atoms within the chemical formula thereof, before selectively forming a W-capping film on the electrical interconnection film. After the completion of the pre-treatment, a W-capping film is selectively formed on the electrical interconnection film and then an upper Cu electrical interconnection is further formed.

18 Claims, 3 Drawing Sheets

SELECTIVE W-CVD METHOD AND METHOD FOR FORMING MULTI-LAYERED CU ELECTRICAL INTERCONNECTION

CROSS-REFERENCE TO RELATED APPLICATION

This application is a National Stage entry of International Application Number PCT/JP2006/304871, filed Mar. 13, 2006. The disclosure of the prior application is hereby incorporated herein in its entirety by reference.

TECHNICAL FIELD

The present invention relates to a selective W-CVD method and, in particular, to a selective W-CVD method in which a W-capping film is selectively formed on a Cu-containing electrical interconnection or distributing wire as well as a method for forming a multi-layered Cu-containing electrical interconnection while making use of this selective W-CVD method.

BACKGROUND ART

There has been proposed a method for capping a Cu electrical interconnection with a metal film in order to improve the reliability of the Cu electrical interconnection. For instance, there have been known a selective film-forming method while making use of the plating method and a method for forming a metal-capping film according to the selective W-CVD method (see, for instance, Japanese Un-Examined Patent Publication Hei 10-229054 (Claims)).

When forming Cu electrical interconnections, the selective W-CVD method is, for instance, carried out, as shown in the attached FIG. 1 as a process flow diagram, by filling, with a Cu-film serving as a lower Cu electrical interconnection, structures such as holes and trenches formed on a substrate provided thereon with an electrical insulating film, according to the plating method (FIG. 1(*a*)); scraping off the excess Cu-film through the CMP (FIG. 1(*b*)); cleaning off the contaminants present on the electrical insulating film and the Cu electrical interconnection through the wet washing (FIG. 1(*c*)); and then selectively forming a capping film on the lower Cu electrical interconnection (FIG. 1(*d*-2)). In this respect, it is common that after the completion of this selective film-formation, an electrical insulating film is further formed thereon for the production of an upper Cu-electrical interconnection (FIG. 1(*e*)); the electrical insulating film is patterned according to any known patterning technique (FIG. 1(*f*)); a barrier metal film is then formed according to, for instance, the PVD, CVD or ALD film-forming technique (FIG. 1 (*g*)); a Cu-seed film is formed according to, for instance, the PVD or CVD film-forming technique (FIG. 1(*h*)); and finally an upper Cu-electrical interconnection film is formed according to the plating method.

The foregoing process as shown in FIG. 1(*d*-2) fundamentally comprises a selective growth of a film and accordingly, the applicability of this CVD process is dependent upon whether the selectivity of the growth of a film can be ensured or not. In general, a pre-treatment (FIG. 1(*d*-1)) is carried out to reduce the oxidized film of Cu and to thus obtain clean Cu metal and then a metal film for forming a capping film is formed in order to selectively grow a metal for capping film prior to the formation of the upper Cu-electrical interconnection. As such a pre-treatment, there has conventionally been used, for instance, a treatment such as an $H_2$-annealing treatment, an $H_2$-plasma treatment or a treatment with H-radicals.

When these pre-treating methods are used, however, the surface of the electrical insulating film is likewise terminated by H atoms and accordingly, the capping metal grows not only on the Cu-electrical interconnection, but also on the electrical insulating film. For this reason, when the conventional selective CVD process, which comprises such a pre-treating step, is used for the formation of a capping film, a practical problem arises.

When a capping film is formed using, for instance, $WF_6$ as a raw gas according to the selective CVD method after the practice of an H2-annealing treatment or an H2-plasma treatment as the foregoing pre-treatment, a W-film is formed, in the form of a blanket, not only on the Cu-electrical interconnection, but also on the electrical insulating film as will be seen from FIG. 2 or the selectivity of the W-film formation is greatly broken. This is because the surface of the electrical insulating film is terminated by H atoms, activated sites are thus formed on the electrical insulating film surface, $WF_6$ may act on the H atoms to thus form HF, the electrical insulating film is thus etched with the resulting HF and this accordingly impairs the selectivity of the W-film formation. The breakage of the selectivity herein used means such a phenomenon that the material for forming a capping film is deposited on the surface of the electrical insulating film. If the selectivity is broken, a problem arises such that it is necessary to carry out an etch back step and this accordingly leads to the reduction of the advantages of the selective CVD method.

DISCLOSURE OF THE INVENTION

Problems that the Invention is to Solve

It is an object of the present invention to solve the foregoing problems associated with the conventional techniques and more specifically to provide a method for forming a useful W-capping layer on a Cu-electrical interconnection film while preventing any breakage of the selectivity of the selective W-CVD method as well as a method for forming a multi-layered Cu-electrical interconnection while making use of this selective W-CVD method.

Means for Solving the Problems

The inventors of this invention have found that the problem of the breakage of the selectivity encountered in the conventional selective CVD method can effectively be solved by the inactivation of the surface of an electrical insulating film through the nitrogenation or alkylation of the electrical insulating film surface in place of the conventional pre-treatment and have thus completed the present invention.

The selective W-CVD method according to the present invention comprises the steps of placing, in a vacuum chamber, a substrate provided, on the surface thereof, with an electrical insulating film having or carrying hole and/or trench structures, which are filled with a Cu-electrical interconnection film; heating the substrate at a predetermined temperature; and introducing a raw gas into the vacuum chamber to thus selectively form a W-capping film on the surface of the Cu-containing electrical interconnection film, wherein, prior to the introduction of the raw gas into the vacuum chamber, the surface of the electrical insulating film and that of the Cu-containing electrical interconnection film are subjected to a pre-treatment using, as a gas for the pre-treatment, (1) a gas of a compound containing N and H atoms within the chemical formula thereof; (2) a mixed gas comprising a gas of a compound containing an N atom within the chemical formula thereof and a gas of a compound containing an H atom within the chemical formula thereof; (3) a gas of a compound containing an Si atom within the chemical formula thereof; or (4) a mixed gas comprising at least one member selected from the group consisting of the foregoing gas of a compound containing N and H atoms within the chemical formula thereof, the foregoing mixed gas comprising a gas of a compound containing an N atom within the chemical formula thereof and a gas of a compound containing an H atom within the chemical formula thereof, and a gas of a compound containing an H atom within the chemical formula thereof, in combination with a gas of a compound containing an Si atom within the chemical formula thereof.

Such a pre-treatment would permit the inhibition of any adsorption of the raw gas on the surface of the electrical insulating film when the subsequent selective W-CVD method is carried out, since the pre-treatment makes the surface of the electrical insulating film inactive. Thus, any decomposition of the raw gas is not caused on the electrical insulating film surface, any film-forming process is accordingly never caused on the surface, the selectivity of the selective W-CVD method is thus never broken and therefore, a W-capping film is selectively formed only on the Cu-containing electrical interconnection.

The foregoing gas of a compound containing both N and H atoms within the chemical formula thereof may preferably be, for instance, a member selected from the group consisting of $NH_3$ gas, $NH_2NH_2$ gas and mixed gases comprising these gases.

The foregoing mixed gas comprising a gas of a compound containing an N atom within the chemical formula thereof and a gas of a compound containing an H atom within the chemical formula thereof may preferably be, for instance, a mixed gas comprising $N_2$ gas and $H_2$ gas.

The foregoing mixed gas comprising $N_2$ gas and $H_2$ gas is preferably one satisfying the following requirement: $0.2 \leqq N_2/H_2 \leqq 1.0$ on the basis of the flow rate of the mixed gas. This is because, if the ratio: $N_2/H_2$ is less than 0.2, the selectivity of the selective W-CVD method is severely broken, while if it exceeds 1.0, it would be difficult to form a W-film because of the considerable reduction of the nucleus-forming frequency on the metal film (Cu-electrical interconnection).

The foregoing Si atom-containing gas may be silanols and such a silanol is preferably at least one member selected from the group consisting of compounds represented by the following chemical formulas: $H_3SiOH$, $R_3SiOH$ (in the formula, R represents an alkyl group) and $R_2Si(OH)_2$ (in the formula, R is the same as that defined above). Among them, more preferably used herein is triethyl silanol.

According to the present invention, the gas of a compound containing N and H atoms within the chemical formula thereof; the mixed gas comprising a gas of a compound containing an N atom within the chemical formula thereof and a gas of a compound containing an H atom within the chemical formula thereof; and the gas of a compound containing an H atom within the chemical formula thereof are introduced into a vacuum chamber in their states activated through the decomposition thereof by the action of the plasma generated in the chamber or by the action of a catalyst, while the gas of a compound containing an Si atom within the chemical formula thereof is introduced into a vacuum chamber in its unprocessed state or in the state activated through the decomposition thereof by the action of the plasma generated in the chamber.

The foregoing gas of a compound containing an Si atom within the chemical formula thereof is first subjected to a pre-treatment such as that described above and then introduced into the chamber when the raw gas is introduced.

The method for the preparation of multi-layered Cu-electrical interconnections according to the present invention comprises the steps of placing, in a vacuum chamber, a substrate provided, on the surface thereof, with an electrical insulating film having hole and/or trench structures, which are filled with a Cu-electrical interconnection film; subjecting the substrate to the aforementioned pre-treatment; then heating the substrate at a predetermined temperature; introducing a raw gas into the vacuum chamber; selectively forming a W-capping film on the surface of the foregoing lower or underlying Cu-containing electrical interconnection film according to any known selective W-CVD method; subsequently forming an electrical insulating film; patterning the electrical insulating film; then forming a barrier metal film and a Cu-seed film; and finally forming an upper Cu-containing electrical interconnection film.

Effects of the Invention

According to the present invention, the surface of a substrate is pre-treated using activated species (such as radicals) generated from a specific gas for pre-treatment and therefore, the following effects can be expected. When a W-capping film is formed on the substrate according to the selective W-CVD method, a W-capping film can efficiently be formed on a Cu-containing electrical interconnection film while preventing any breakage of the selectivity of the selective CVD method and a desired multi-layered Cu-electrical interconnection can be prepared while making use of this selective CVD method.

BEST MODE FOR CARRYING OUT THE INVENTION

According to a mode for carrying out the present invention, the surface of the electrical insulating film and that of the Cu-containing electrical interconnection film are subjected to a pre-treatment, prior to the introduction of the raw gas, using the gas described above or (1) a gas of a compound containing N and H atoms within the chemical formula thereof; (2) a mixed gas comprising a gas of a compound containing an N atom within the chemical formula thereof and a gas of a compound containing an H atom within the chemical formula thereof; (3) a gas of a compound containing an Si atom within the chemical formula thereof; or (4) a mixed gas comprising at least one member selected from the group consisting of the foregoing gas of a compound containing N and H atoms within the chemical formula thereof, the foregoing mixed gas comprising a gas of a compound containing an N atom within the chemical formula thereof and a gas of a compound containing an H atom within the chemical formula thereof, and a mixed gas comprising a gas of a compound containing an H atom within the chemical formula thereof and a gas of a compound containing an Si atom within the chemical formula thereof, as a gas for the pre-treatment, wherein the pre-treatment gas is in its activated state or in its unprocessed state.

In this case, when the pre-treatment is carried out using the foregoing gas (1), (2), (3) or (4) and preferably the foregoing gas (1) or (2) as the pre-treatment gas, and then an intended film is formed by the introduction of a raw gas, a gas of a compound containing an Si atom within the chemical formula thereof may be introduced into the vacuum chamber separately or simultaneous with the raw gas. More specifically, the gas of a compound containing an Si atom within the chemical formula thereof may be used during the pre-treatment or it may always flow through the chamber during the entire film-forming operation or it may be used throughout the pre-treatment and the film-forming operation.

According to the present invention, the gas of a compound containing N and H atoms within the chemical formula thereof; and the mixed gas comprising a gas of a compound containing an N atom within the chemical formula thereof and a gas of a compound containing an H atom within the chemical formula thereof are introduced into the vacuum chamber in their states activated through the decomposition thereof by the action of the plasma generated in the chamber or by the action of a catalyst, while the gas of a compound containing an Si atom within the chemical formula thereof is introduced into the vacuum chamber in its unprocessed state or in the state activated through the decomposition thereof by the action of the plasma generated in the chamber. The practice of such a pre-treatment would permit the elimination of any breakage of the selectivity of the selective W-CVD method and the formation of a desired W-capping film.

In the present invention, the electrical insulating film is not restricted to any specific one insofar as it is currently used in the field of the semiconductor industry and it may be, for instance, a film of any known electrical insulating material such as an SOG film, an SiOC film or a nitride film in addition to an $SiO_2$ film. In addition, the Cu-containing electrical interconnection film used in the present invention is an electrical interconnection film consisting of, for instance, a Cu film or a Cu alloy film (such as a film of CuAl, CuAg or CuSn).

The terminal O atoms and/or OH groups present on the surface of the electrical insulating film are converted into terminal N atoms and/or NH groups by the foregoing pre-treatment, for instance, the pre-treatment using a gas of a compound containing N and H atoms within the chemical formula thereof. If the outermost layer of the electrical insulating film is thus converted into one free of any active site, any adsorption of a raw gas (for instance, a silane gas such as SiH4) on the surface of the substrate is inhibited and this accordingly leads to the elimination of not only any decomposition of the raw gas on the surface of the electrical insulating film, but also any formation of a film. For this reason, a W-capping film is formed only on the Cu-containing electrical interconnection film and the selectivity of the selective W-CVD method is thus never broken.

Moreover, when the pre-treatment is carried out, prior to the introduction of a raw gas into a vacuum chamber, while introducing a gas of a compound containing an Si atom within the chemical formula thereof (for instance, a gas of a silanol such as triethyl silanol) alone or in combination with the foregoing gas (1) or (2), or when the Si atom-containing gas is introduced into the vacuum chamber upon the introduction of the raw gas into the same, the terminal O atoms, OH groups or the like present on the surface of the electrical insulating film are converted into —O—Si—R groups (R: alkyl group) and the outermost layer of the electrical insulating film is correspondingly terminated by alkyl groups. If the outermost layer of the electrical insulating film is thus converted into one free of any active site, any adsorption of a raw gas (for instance, a silane gas such as $SiH_4$) on the surface of the substrate is substantially inhibited and this accordingly leads to the elimination of not only any decomposition of the raw gas on the surface of the electrical insulating film, but also any formation of a film on the electrical insulating film. For this reason, a W-capping film is formed only on the Cu-containing electrical interconnection film and the selectivity of the selective W-CVD method is thus never broken.

As has been described above, the Si atom-containing gas may be silanols each containing Si atom and an OH group represented by the following chemical formulas: $H_3SiOH$, or alkyl-substituted derivatives thereof represented by the following chemical formulas: $R_3SiOH$ and $R_2Si(OH)_2$ (in the formulas, R represents an alkyl group), with triethyl silanol being preferably used herein. In this respect, the alkyl group is preferably a lower alkyl group such as a methyl, ethyl, propyl, butyl, pentyl, or hexyl group. These silanols may be used alone or in any combination with the foregoing gas (1) or (2) in the pre-treatment prior to the practice of the selective W-CVD method, or it may be used simultaneous with the raw gas when forming a desired film according to the selective W-CVD method. In this case, it is preferred to use the $H_3SiOH$ gas together with the N and H atom-containing gas.

According to the present invention, as has been discussed above, the foregoing N and/or H atom-containing gas is introduced into the vacuum chamber in the form of activated species (radicals) obtained through the decomposition thereof by the action of plasma generated therein or in the form of activated species (radicals) obtained through the decomposition thereof by the use of a catalyst. In this connection, the method for forming such activated species is not restricted to any specific one and any known method can be used herein.

The method for generating plasma in the foregoing pre-treatment is not restricted to any particular one and it is sufficient to use any known method currently used in the field of the production of thin films used in semiconductor devices such as the thermoelectronic discharge type one, the diode discharge type one, the magnetron discharge type one, the electrodeless discharge type one or the ECR discharge type one and accordingly, it is possible to use, for instance, the parallel plate type plasma-generation system using RF or the ICP (inductively coupled plasma-generation) system.

In addition, the method, which makes use of a catalyst and which is employed instead of the plasma-generation system, is not likewise restricted to any particular one and any known method using a catalyst can be adopted herein inasmuch as it can be used as a means for generating radicals. For instance, the radicals of the pre-treatment gas used herein may be generated by bringing the pre-treatment gas into close contact with a known metallic catalyst such as W previously heated to a temperature on the order of about 1700 to 1800° C. to thus activate the gas and to generate radicals.

In the present invention, the pre-treatment is preferably carried out at a temperature of not more than 300° C. This is because, if the pre-treatment temperature exceeds 300° C., a problem arises such that the Cu per se undergoes, for instance, expansion and this in turn results in the reduction of the reliability of the resulting Cu electrical interconnection. The desired effect of the pre-treatment can be ensured if the pre-treatment temperature is not less than about 100° C.

According to the present invention, the pre-treatment is carried out by heating a wafer placed in a vacuum chamber to a temperature of not more than 300° C. (for instance, 250° C.), and then generating plasma using an N atom and/or H atom-containing gas under the usual plasma generation conditions. The H radicals thus generated can remove any oxide film present on the Cu-containing film, while the radicals thus generated such as N radicals and/or NH radicals take part in the nitrogenation of the surface of the electrical insulating film. In this respect, when using an Si atom-containing gas, the surface of the electrical insulating film is subjected to alkylation. Subsequently, a selective W-CVD process is carried out at a temperature of not more than 300° C. (for instance, 250° C.). The lower limit of this film-forming temperature is not restricted to any particular one, inasmuch as it may allow the formation of a W-capping film. For instance, a desired W-capping film can be formed if the film-forming temperature is not less than about 200° C.

The pre-treatment used in the present invention may be carried out in a chamber different from the processing chamber for the selective W-CVD process or these steps may likewise be carried out in the same chamber.

The raw gas used in the present invention is not restricted to any specific one, insofar as it is one currently used in the W-CVD method, and examples thereof may include $WF_6$ and $W(CO)_6$ and examples of auxiliary gas used for the W-film formation may include gases such as $SiH_4$ and $H_2$. The raw gas may be introduced into the vacuum chamber while using an inert gas such as argon gas as a carrier gas. In this case, W-capping film would be formed according to the following reaction scheme:

$$2WF_6+3SiH_4 \rightarrow 2W+3SiF_4+6H_2$$

$$WF_6+3H_2 \rightarrow W+6HF$$

The selective W-CVD process usable herein may be, for instance, a method for reducing $WF_6$ as a raw gas with $SiH_4$, or a process using $H_2$ gas as a carrier gas. In this case, hydrogen gas or other reducing gases may be used in place of mono-silane as the reducing gas. Instead of this reducing gas, it is also possible to use, for instance, Si exposed at the bottom of the holes and/or trenches formed on the electrical insulating film, as a reducing agent. The foregoing pre-treatment is useful even for the prevention of any breakage of the selectivity in other adapted processes such as the filling up of via plugs.

In addition, the method for preparing a multi-layered Cu-containing electrical interconnection according to the present invention would permit the formation of an upper Cu electrical interconnection by forming a W-capping film according to the foregoing method; forming an electrical insulating film (for instance, an $SiO_2$ film) according to the usual CVD method; patterning the electrical insulating film according to the method currently used; forming, if desired, a barrier metal film; forming a Cu-seed film on the barrier metal film according to the method currently used; and then forming a desired upper Cu electrical interconnection according to, for instance, the usual plating method.

EXAMPLE 1

In this Example, a Cu electrical interconnection-producing process was carried out according to the processes as shown in FIG. 1 as a process flow diagram.

A substrate to be processed in this Example was an Si wafer having a diameter of 8 inches provided, on the surface thereof, with an electrical insulating film ($SiO_2$ thin film) on which hole and trench structures had been formed. The structures such as holes and trenches formed on a substrate were filled with a Cu-film serving as a lower electrical interconnection, according to the usual plating method (FIG. 1(*a*)); and then the excess Cu-film was removed through scraping according to the usual CMP technique (FIG. 1(*b*)).

The substrate thus obtained was subjected to a degassing treatment (degassing condition: 250° C.), the degassed substrate was introduced into the chamber for the pre-treatment, and then the substrate was heated to a pre-treating temperature of 250° C. Subsequently, 50 sccm of $N_2$ gas and 100 sccm of $H_2$ gas were simultaneously introduced into the chamber while controlling the flow rates thereof using a mass flow controller (MFC), a discharge was then induced with an RF plasma generator (plasma-generation conditions: RF: 50 W; a pressure: 5 Pa) to thus subject the substrate surface to a pre-treatment for 30 seconds (FIG. 1(*d*-1)). At this stage, the oxide film of Cu remaining on the surface of the Cu electrical interconnection film was removed through the reduction thereof due to the presence of the H radicals generated by the decomposition of the foregoing $H_2$ gas through the action of the plasma generated in the chamber, while the surface of the electrical insulating film was nitrogenated due to the presence of N radicals generated by the decomposition of the foregoing $N_2$ gas through the action of the plasma likewise generated therein.

After the completion of the foregoing pre-treatment, the processed substrate was withdrawn from the chamber for pre-treatment by the manipulation of a vacuum robot, then transferred to a chamber for carrying out the selective W-CVD method, and a W-capping film was formed according to the selective W-CVD process which made use of $WF_6$ and $SiH_4$ (FIG. 1(*d*-2)). In the chamber for carrying out the selective W-CVD method, the substrate thus transferred was heated up to a temperature of 250° C., then the substrate was maintained at that temperature and 10 sccm of $WF_6$ gas and 5 sccm of $SiH_4$ gas were then introduced into the chamber to thus form a W-film over 20 seconds. In this case, argon gas may likewise be used as a carrier gas.

In this connection, FIG. 3 shows the results of the selectivity of the film-forming process carried out as described above, while comparing them with the results of the selectivity observed when a film was formed while carrying out, as a pre-treatment, only an $H_2$-plasma treatment or an $H_2$-annealing treatment. As will be clear from the data plotted on FIG. 3, it was confirmed that the selectivity of the selective W-CVD process was severely broken in the case of the film obtained when only $H_2$ gas was used for the pre-treatment, but the selective W-CVD process was found to be completely free of any breakage of the selectivity of the process, when the pre-treatment was carried out using the plasma containing N atoms and H atoms.

Moreover, FIG. 4 shows an SEM image of the substrate obtained by forming a W-capping film on the Cu electrical interconnection after subjecting it to a pre-treatment carried out in the plasma generated using 50 sccm of $N_2$ gas and 100 sccm of $H_2$ gas like the foregoing treatment. This SEM image clearly indicates that a W-film is selectively formed on the Cu film, while such a film is never formed on the electrical insulating film, or that the selectivity of the W film-formation is not broken at all.

To form an upper Cu electrical interconnection on the substrate provided, on the surface thereof, with the W-capping film thus formed, an electrical insulating film (an $SiO_2$ film) was formed according to the usual CVD method (FIG. 1(*e*)), the electrical insulating film thus formed was then patterned according to the usual patterning method (FIG. 1(*f*)), a barrier metal film was, if desired, formed thereon (FIG. 1(*g*)), a Cu seed film was formed on the barrier metal film (FIG. 1(*h*)), and an upper Cu electrical interconnection film was formed according to the plating method to thus give a multi-layered Cu electrical interconnection.

EXAMPLE 2

The same procedures or process used in Example 1 were repeated except for using 100 sccm of $NH_3$ gas as the pre-treating gas and a film forming temperature of 150° C. to thus form a multi-layered Cu electrical interconnection. The results obtained in the examination of the selectivity of the film-formation (SEM image) clearly indicate that any breakage of the selectivity is not observed at all, as in the case of Example 1.

COMPARATIVE EXAMPLE 1

The same method used in Example 1 was repeated except that 15 sccm of $N_2$ gas and 100 sccm of $H_2$ gas were simultaneously introduced into the chamber for the pre-treatment and that 110 sccm of $N_2$ gas and 100 sccm of $H_2$ gas were simultaneously introduced into the chamber for the pre-treatment. In either of these cases, the results obtained in the examination of the selectivity of the film-formation (SEM image) clearly indicate that the selectivity was broken.

COMPARATIVE EXAMPLE 2

The same method used in Example 1 was repeated except that the pre-treatment temperature was set at 350° C. The results obtained in the examination of the selectivity of the film-formation (SEM image) clearly indicate that the selectivity was broken.

EXAMPLE 3

The same process used in Example 1 was repeated except for using 0.1 sccm of triethyl silanol gas as the pre-treatment gas. The results obtained in the examination of the selectivity of the film-formation (SEM image) clearly indicate that any breakage of the selectivity is not observed at all, as in the case of Example 1.

INDUSTRIAL APPLICABILITY

According to the present invention, the surface of an electrical insulating film and that of a Cu-containing electrical interconnection film are pre-treated with a gas of a specific compound containing an atom or atoms selected from N, H and Si atoms in their specific states and thereafter, a W-capping film is formed according to the selective W-CVD method. Thus the present invention permits the selective formation of a W-capping film on a Cu-containing electrical interconnection film while preventing any breakage of the selectivity of the selective W-CVD method and therefore, the present invention can effectively be used in the field of the Cu-containing electrical interconnection film formation in the semiconductor industry.

Figure 1:
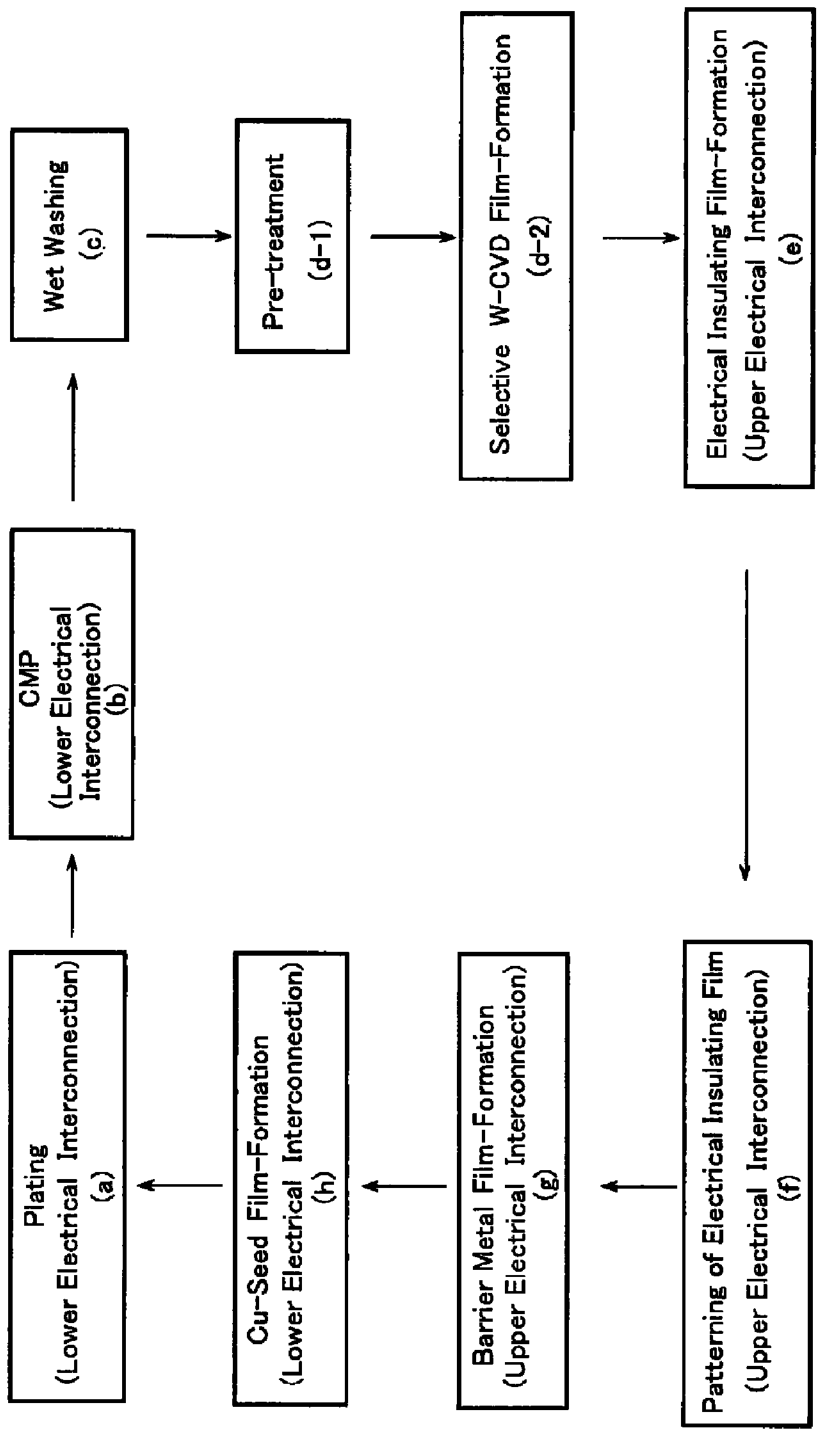
FIG. 1 is a flow diagram showing the process for carrying out the selective W-CVD method.
Figure 2:
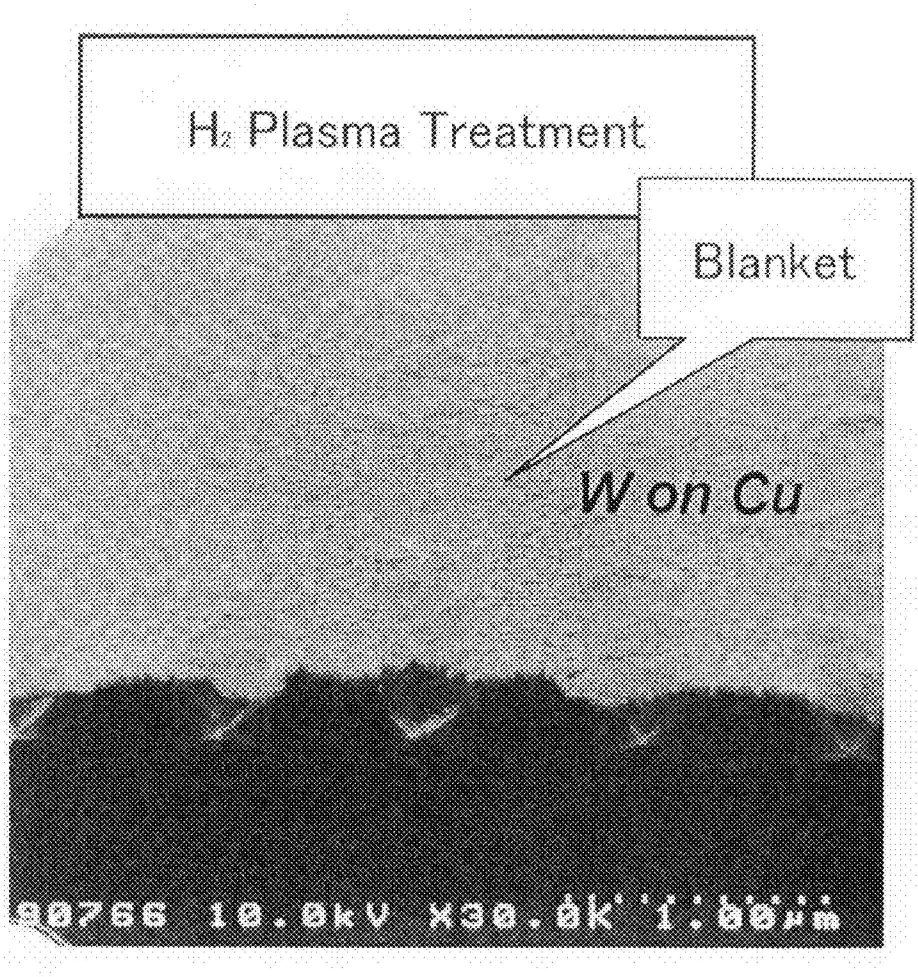
FIG. 2 is an SEM image of a W-capping film obtained when a substrate is pre-treated with an $H_2$ plasma treatment and then the film is formed according to the selective W-CVD method.
Figure 3:
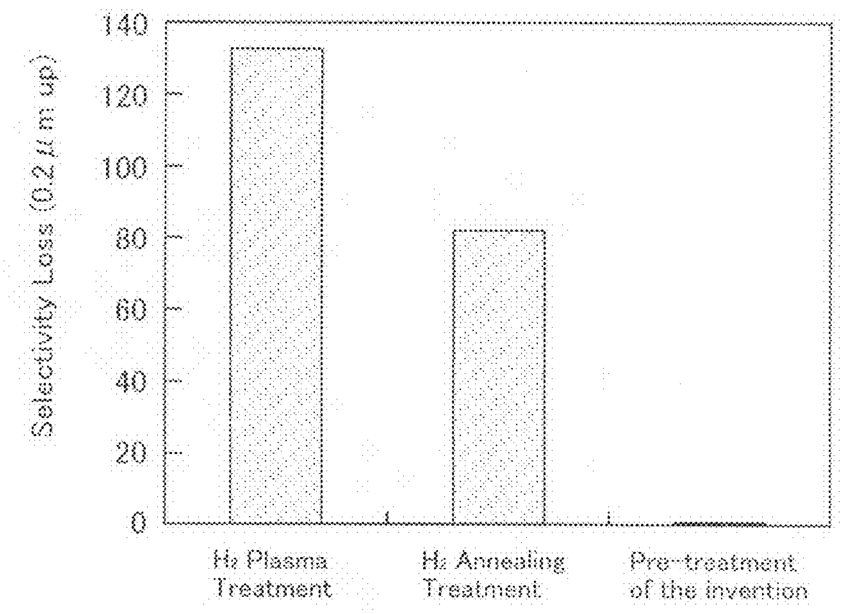
FIG. 3 is a graph showing the results obtained in the examination of the selectivity of the film-forming process carried out according to the method used in Example 1, while comparing the same with those obtained in Comparative Example.
Figure 4:
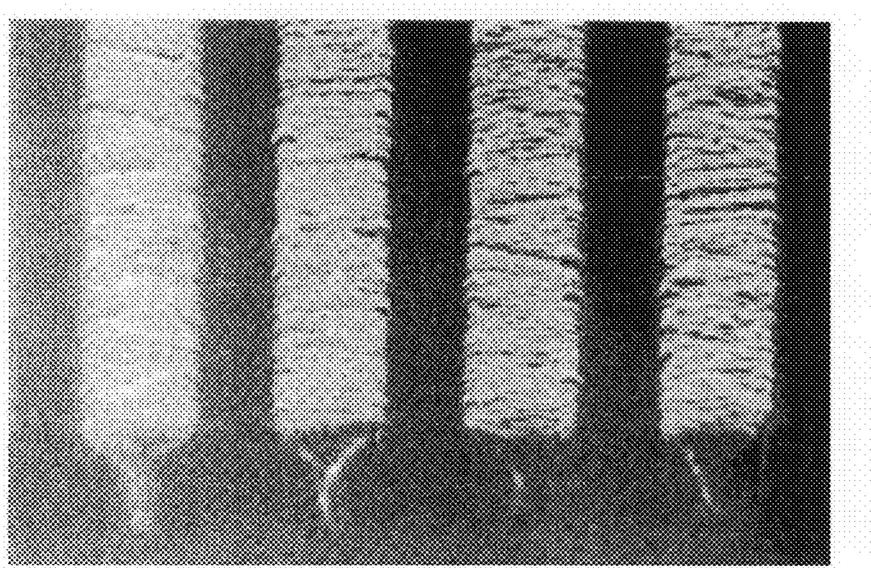
FIG. 4 is an SEM image of a W-capping film obtained when carrying out the film-forming process according to the method used in Example 1.

What is claimed is:

1. A selective W-CVD method which comprises the steps of placing, in a vacuum chamber, a substrate provided, on the surface thereof, with an electrical insulating film having hole and/or trench structures which are filled with a Cu-containing electrical interconnection film; heating the substrate at a predetermined temperature; and introducing a raw gas into the vacuum chamber to thus selectively form a W-capping film on the surface of the Cu-containing electrical interconnection film, wherein, prior to the introduction of the raw gas into the vacuum chamber, the surface of the electrical insulating film and that of the Cu-containing electrical interconnection film are subjected to a pre-treatment using, as a gas for the pre-treatment, (1) a gas of a compound containing N and H atoms; (2) a mixed gas comprising a gas of a compound containing an N atom and a gas of a compound containing an H atom; (3) a gas of a compound containing an Si atom; or (4) a mixed gas comprising at least one member selected from the group consisting of the foregoing gas of a compound containing N and H atoms, the mixed gas comprising a gas of a compound containing an N atom and a gas of a compound containing an H atom, and a gas of a compound containing an H atom, in combination with a gas of a compound containing an Si atom.

2. The selective W-CVD method as set forth in claim 1, wherein the gas of a compound containing both N and H atoms is a member selected from the group consisting of $NH_3$ gas, $NH_2NH_2$ gas and mixture thereof.

3. The selective W-CVD method as set forth in claim 1, wherein the mixed gas comprising a gas of a compound containing an N atom and a gas of a compound containing an H atom is a mixed gas comprising $N_2$ gas and $H_2$ gas.

4. The selective W-CVD method as set forth in claim 3, wherein the mixed gas comprising $N_2$ gas and $H_2$ gas is one satisfying the following relationship: $0.2 \leqq N_2/H_2 \leqq 1.0$ on the basis of the flow rate of the mixed gas.

5. The selective W-CVD method as set forth in claim 1, wherein the gas of a compound containing an Si atom is a gas of a silanol.

6. The selective W-CVD method as set forth in claim 5, wherein the silanol is at least one member selected from the group consisting of compounds represented by the following chemical formulas: $H_3SiOH$, $R_3SiOH$ and $R_2Si(OH)_2$, wherein R is an alkyl group.

7. The selective W-CVD method as set forth in claim 6, wherein the silanol is triethyl silanol.

8. The selective W-CVD method as set forth in claim 1, wherein the gas of a compound containing N and H atoms; the mixed gas comprising a gas of a compound containing an N atom and a gas of a compound containing an H atom; and the gas of a compound containing an H atom are introduced into a vacuum chamber in their states activated through the decomposition thereof by the action of the plasma generated in the chamber or by the action of a catalyst, while the gas of a compound containing an Si atom is introduced into a vacuum chamber in its unprocessed state or in the state activated through the decomposition thereof by the action of the plasma generated in the chamber.

9. A method for preparing a multi-layered Cu electrical interconnection comprising the steps of placing, in a vacuum chamber, a substrate provided, on the surface thereof, with an electrical insulating film having hole and/or trench structures which are filled with a Cu-containing electrical interconnection film; pre-treating the substrate according to the method as set forth in claim 1; heating the substrate at a predetermined temperature; subsequently introducing a raw gas into the vacuum chamber;

selectively forming a W-capping film on the surface of the foregoing underlying Cu-containing electrical interconnection film according to the selective W-CVD method; then forming an electrical insulating film; patterning the electrical insulating film; thereafter forming a Cu-seed film; and finally forming an upper Cu-containing electrical interconnection film.

10. A selective W-CVD method which comprises the steps of placing, in a vacuum chamber, a substrate provided, on the surface thereof, with an electrical insulating film having hole and/or trench structures which are filled with a Cu-containing electrical interconnection film; heating the substrate at a predetermined temperature; and introducing a raw gas into the vacuum chamber to thus selectively form a W-capping film on the surface of the Cu-containing electrical interconnection film, wherein, prior to the introduction of the raw gas into the vacuum chamber, the surface of the electrical insulating film and that of the Cu-containing electrical interconnection film are subjected to a pre-treatment using, as a gas for the pre-treatment, (1) a gas of a compound containing N and H atoms; (2) a mixed gas comprising a gas of a compound containing an N atom and a gas of a compound containing an H atom; (3) a gas of a compound containing an Si atom; or (4) a mixed gas comprising at least one member selected from the group consisting of the foregoing gas of a compound containing N and H atoms, for the mixed gas comprising a gas of a compound containing an N atom and a gas of a compound containing an H atom, and a gas of a compound containing an H atom, in combination with a gas of a compound containing an Si atom, and wherein a gas of a compound containing an Si atom, is then introduced into the vacuum chamber upon the introduction of the raw gas into the chamber.

11. The selective W-CVD method as set forth in claim 10, wherein the gas of a compound containing both N and H atoms is a member selected from the group consisting of $NH_3$ gas, $NH_2NH_2$ gas and mixture thereof.

12. The selective W-CVD method as set forth in claim 10, wherein the mixed gas comprising a gas of a compound containing an N atom and a gas of a compound containing an H atom is a mixed gas comprising $N_2$ gas and $H_2$ gas.

13. The selective W-CVD method as set forth in claim 12, wherein the mixed gas comprising $N_2$ gas and $H_2$ gas is one satisfying the following relationship: $0.2 \leqq N_2/H_2 \leqq 1.0$ on the basis of the flow rate of the mixed gas.

14. The selective W-CVD method as set forth in claim 10, wherein the gas of a compound containing an Si atom is a gas of a silanol.

15. The selective W-CVD method as set forth in claim 14, wherein the silanol is at least one member selected from the group consisting of compounds represented by the following chemical formulas: $H_3SiOH$, $R_3SiOH$ and $R_2Si(OH)_2$, wherein R is an alkyl group.

16. The selective W-CVD method as set forth in claim 15, wherein the silanol is triethyl silanol.

17. The selective W-CVD method as set forth in claim 10, wherein the gas of a compound containing N and H atoms; the mixed gas comprising a gas of a compound containing an N atom and a gas of a compound containing an H atom within the and the gas of a compound containing an H atom are introduced into a vacuum chamber in their states activated through the decomposition thereof by the action of the plasma generated in the chamber or by the action of a catalyst, while the gas of a compound containing an Si atom is introduced into a vacuum chamber in its unprocessed state or in the state activated through the decomposition thereof by the action of the plasma generated in the chamber.

18. A method for preparing a multi-layered Cu electrical interconnection comprising the steps of placing, in a vacuum chamber, a substrate provided, on the surface thereof, with an electrical insulating film having hole and/or trench structures which are filled with a Cu-containing electrical interconnection film; pre-treating the substrate according to the method as set forth in claim 8; heating the substrate at a predetermined temperature; subsequently introducing a raw gas into the vacuum chamber;

selectively forming a W-capping film on the surface of the foregoing underlying Cu-containing electrical interconnection film according to the selective W-CVD method; then forming an electrical insulating film; patterning the electrical insulating film; thereafter forming a Cu-seed film; and finally forming an upper Cu-containing electrical interconnection film.

* * * * *